United States Patent
Okubo et al.

(10) Patent No.: US 8,030,995 B2
(45) Date of Patent: Oct. 4, 2011

(54) POWER CIRCUIT USED FOR AN AMPLIFIER

(75) Inventors: Yoichi Okubo, Tokorozawa (JP); Manabu Nakamura, Akishima (JP); Junya Dosaka, Hamuta (JP); Yasuhiro Takeda, Kodaira (JP); Taizo Ito, Kodaira (JP); Naoki Hongo, Ome (JP); Taizo Yamawaki, Tokyo (JP); Takashi Kawamoto, Tokyo (JP); Akira Maeki, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 31 days.

(21) Appl. No.: 12/644,833

(22) Filed: Dec. 22, 2009

(65) Prior Publication Data

US 2010/0171553 A1 Jul. 8, 2010

(30) Foreign Application Priority Data

Dec. 25, 2008 (JP) ................................. 2008-329679
Nov. 2, 2009 (JP) ................................. 2009-251789

(51) Int. Cl.
*H03G 3/00* (2006.01)

(52) U.S. Cl. ........................................ 330/127; 330/297
(58) Field of Classification Search .................. 330/127, 330/136, 141, 297
See application file for complete search history.

(56) References Cited

U.S. PATENT DOCUMENTS

| | | | | |
|---|---|---|---|---|
| 6,583,664 | B2 * | 6/2003 | Mathe et al. | 330/10 |
| 7,808,323 | B2 * | 10/2010 | Takinami et al. | 330/297 |
| 2009/0191826 | A1 * | 7/2009 | Takinami et al. | 455/110 |
| 2009/0289720 | A1 * | 11/2009 | Takinami et al. | 330/297 |

OTHER PUBLICATIONS

Feipeng Wang et al., "*An Improved Power-Added Efficiency 19-dBm Hybrid Envelope Elimination and Restoration Power Amplifier for 802.11g WLAN Applications*", IEEE Transactions on Microwave Theory and Techniques, vol. 54, No. 12, Dec. 2006.
Geoffrey R. Walker, "*A Class B Switch-Mode Assisted Linear Amplifier*", IEEE Transactions on Power Electronics, vol. 18, No. 6, Nov. 2003.
George B. Yundt, "*Series- or Parallel-Connected Composite Amplifiers*", IEEE Transactions on Power Electronics, vol. PE-1, No. 1, Jan. 1986.

* cited by examiner

*Primary Examiner* — Steven J Mottola
(74) *Attorney, Agent, or Firm* — Wenderoth, Lind & Ponack, L.L.P.

(57) ABSTRACT

A power circuit used for an amplifier, which includes an amplifier provided with a linear amplifier serving as a voltage source, a DC/DC converter serving as a current source, a hysteresis comparator controlling the DC/DC converter, and a current detector detecting output current from the linear amplifier to output the detected output current to the hysteresis comparator; and a switching restricting device for restricting a switching interval in the DC/DC converter such that the switching interval is not equal to or less than a constant time or is not shorter than the constant time.

4 Claims, 11 Drawing Sheets

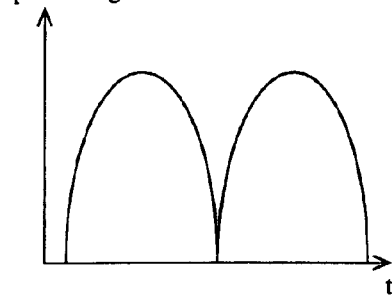
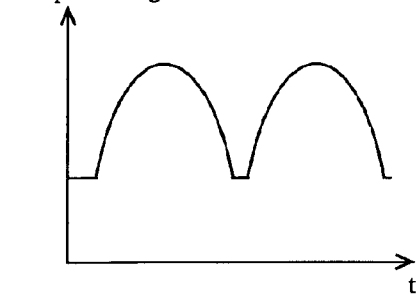
Fig.4A  Fig.4B
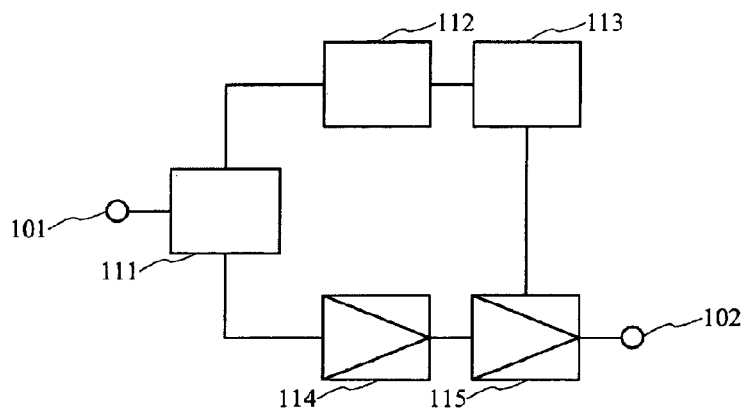
Fig.5

(a)
Voltage of node P (b)
Voltage of current detector

Hysteresis width

Follow mode(DC)

Non-follow mode(DC+AC)

POWER CIRCUIT USED FOR AN AMPLIFIER

BACKGROUND OF THE INVENTION

1. Technical Field of the Invention

The present invention relates to a power circuit, for example, capable of preventing efficiency from being reduced by an increase in switching loss of a DC/DC converter when a wideband envelope signal is received.

2. Description of the Related Art

According to the related art, when a radio frequency signal such as a CDMA (Code Division Multiple Access) signal or a multi-carrier signal is power-amplified, a distortion compensation function is added to a common amplifier and an operation range of the common amplifier is expanded up to the vicinity of a saturation region, so that low power consumption is achieved. The distortion compensation function includes a feed-forward compensation function, a pre-distortion compensation function or the like, but there is a limitation in the lowering of power consumption by only using the distortion compensation. In this regard, in recent years, a method of achieving high efficiency by using a saturated amplifier has been spotlighted. Particularly, it has been considered that a scheme for changing the power of the saturated amplifier is effective.

Further, in terms of demands for a power amplifier of a transmitter, in order to reduce the limitation on installation location or installation cost, reduction in size and weight thereof has been strongly required. The volume or weight of an apparatus increases with the number of fins for dissipating heat generated by power loss. However, the number of the fins is reduced by an improvement in power efficiency, resulting in reduction in size and weight of the apparatus.

A method of improving the power efficiency includes an EER (Envelope Elimination and Restoration) scheme of changing a supply voltage of a saturated power amplifier.

FIG. 5 is a block diagram showing a configuration example of an EER scheme of changing power by using a saturated amplifier according to the related art.

According to the configuration example, a distributor 111, an envelope detector 112 and a power circuit 113 provided on one distribution path, and a RF (Radio Frequency) limit amplifier 114 and a main amplifier 115 provided on the other distribution path, are provided between an input terminal 101 and an output terminal 102.

An RF signal input from the input terminal 101 is distributed by the distributor 111.

In relation to a part of the distributed signal, an evelope is detected by the envelope detector 112, and power output of the power circuit 113 is changed according to a signal (amplitude information) of the detected envelope. Thus, the power circuit 113 changes a supply voltage of the main amplifier 115 according to the input envelope signal.

In relation to the other part of the distributed RF signal, amplitude variation is removed by the RF limit amplifier 114 and the RF signal is amplified in a saturated state by the main amplifier 115 while only information on a phase component is being maintained.

Herein, since power (power from the power circuit 113) of the main amplifier 115 is changed according to the amplitude information, the amplitude information is restored. Since the amplifier (the main amplifier 115) is always used (operates) in a saturated state, efficiency thereof is good. Thus, high efficiency is achieved.

Since the main amplifier 115 operates in the saturated state, high efficiency is achieved. However, in terms of the entire efficiency of the EER scheme, the efficiency of the power circuit 113 is also important. For example, a band of the envelope signal of a wideband signal such as a W (Wideband)-CDMA signal or an OFDM (Orthogonal Frequnecy Division Multiplexing) signal is wide, and the power circuit 113 has to operate at a high speed.

For example, a band of wideband envelope information such as a CDMA signal or a multi-carrier signal is wide, and an envelope amplifier as shown in FIG. 6, which changes power, has been known as a power circuit operating at a high speed (For example, refer to "An Improved Power-Added Efficiency 19-dBm Hybrid Envelope Elimination and Restoratin Power Amplifier for 802.11g WLAN Applications", IEEE MTT, VOL. 54, NO. 12, 2006).

FIG. 6 is a circuit diagram showing a configuration example of an envelope amplifier (power circuit) that changes power.

In such a method, switching power, which is assisted by a linear amplifier employed in an audio amp or the like, is used. In general, it is referred to as a linear assist class BD amplifier (For example, refer to "A Class B Switch-Mode Assisted Linear Amplifier" IEEE PE, VOL. 18, NO. 6, 2003, and "Series- or Parallel-Connected Composite Amplifiers" IEEE PE, NO. 1, 1986).

The envelope amplifier according to the example includes an OP amp 12, a hysteresis comparator 13, a current detector 14 and a DC (Direct Current)/DC converter 15, which are provided between an input terminal 1 and an output terminal 2.

The DC/DC converter 15 includes a supply voltage 31, a switch device 32, a diode 33 and an inductance 34.

Further, FIG. 6 shows nodes P, P1 and P2.

As described above, the circuit includes the OP amp 12 serving as a wideband voltage source, the DC/DC converter 15 with high efficiency, the hysteresis comparator 13 serving as a control circuit, and the current detector 14.

The circuit operates in a follow mode and a non-follow mode.

First, the follow mode will be described.

A signal detected by the envelope detector 112 as shown in FIG. 5 is input to the input terminal 1, and converted into a voltage source by the OP amp 12. When output from the envelope detector 112 is a DC portion, a voltage of the node P1 of the current detector 14 is increased, and the hysteresis comparator 13 operates to turn on the switch device 32. The supply voltage 31 is applied to the node P, which serves as a connection point of the switch device 32 and the inductance 34, and passes through the inductance 34 so that a voltage of the output terminal 2 is gradually increased.

If the output of the output terminal 2 is higher than the output from the OP amp 12, the node P2 becomes high and the hysteresis comparator 13 turns off the switch device 32. Thus, current flowing through the inductance 34 flows through the diode 33, and the output of the output terminal 2 is gradually reduced. Then, the hysteresis comparator 13 turns on the switch device 32, and repeats the above operation. That is, the hysteresis comparator 13 self-oscillates to control the switch device 32.

The self-oscillating frequency is determined by a hysteresis width with the degree of freedom, the inductance 34, the supply voltage 31, and a resistance value of the current detector 14. However, if the self-oscillating frequency is set to be high, since switching loss is increased or it exceeds a limit value of the switch device 32, the self-oscillating frequency is limited.

Further, when the output from the envelope detector 112 has DC and AC components and it is a low frequency portion, similar to the case in which the output from the envelope detector 112 is the DC component, PWM (Pulse Width Modulation) of the DC/DC converter 15 is made to follow, so that output power is supplied from the DC/DC converter 15 with high efficiency.

Second, the non-follow mode will be described.

If the output from the envelope detector 112 is the DC and AC components of a high frequency, the PWM of the DC/DC converter 15 is not made to follow, so that the output power is supplied from the OP amp 12. That is, if the output from the envelope detector 112 is the DC and the AC with the high frequency, the DC component and AC component of a low frequency are supplied from the DC/DC converter 15 because the AC component of the high frequency is removed by the inductance 34 from the output of the DC/DC converter 15. The AC component of the high frequency is supplied from the OP amp 12.

At this time, DC current and AC high frequency component are generated at the nodes P1 and P2 of both ends of the current detector 14, so that the output from the hysteresis comparator 13 operates the switch device 32 by using the high frequency of the AC component employed as a basic frequency.

According to a method of improving the efficiency of the power circuit, for example, the AC component, which can be made to follow due to an increase in the self-oscillating frequency, can be increased up to a high frequency (high frequency portion). However, since a band of the communication system such as the WiMAX or the LTE is wide and a band of the envelope signal becomes wider, the AC component is limited.

Thus, in the case of the follow mode, the voltage is supplied from the DC/DC converter 15 to the output terminal 2, so that efficiency is improved. Further, in the case of the non-follow mode, the AC component of the high frequency is supplied from the OP amp 12, and the AC component of the low frequency and the DC component are supplied from the OP amp 12 and the DC/DC converter 15 with a lower efficiency.

FIG. 7(a) is a graph showing one example of variation of the voltage of the node P as a function of time in the follow mode (DC). In FIG. 7(a), a horizontal axis denotes time t and a vertical axis denotes the voltage of the node P.

FIG. 7(b) is a graph showing one example of variation of the voltage of the current detector 14 as a function of time in the follow mode (DC). In FIG. 7(b), the horizontal axis denotes time t and the vertical axis denotes the voltage of the current detector 14.

FIG. 8(a) is a graph showing one example of variation of the voltage of the node P as a function of time in the non-follow mode (DC+AC). In FIG. 8(a), the horizontal axis denotes time t and the vertical axis denotes the voltage of the node P.

FIG. 8(b) is a graph showing one example of variation of the voltage of the current detector 14 as a function of time in the non-follow mode (DC+AC). In FIG. 8(b), the horizontal axis denotes time t and the vertical axis denotes the voltage of the current detector 14.

As shown in FIGS. 7(a) and 7(b), in the case of the DC component in the follow mode, the voltage of the node P is a rectangular wave and a high efficiency switching operation is performed. However, as shown in FIGS. 8(a) and 8(b), in the case of the DC and the AC high frequency in the non-follow mode, a switching operation is performed at a high frequency which is identical to that of the input AC component. Thus, the waveform of the node P is changed from a rectangular wave to a trapezoidal wave, so that the switching loss is large.

As described above, according to the power circuit, a low frequency component is supplied from the DC/DC converter 15 with the high efficiency, and a high frequency component is supplied from the OP amp 12 which can operate at a high speed, so that a high speed operation can be performed with high efficiency.

[First Problem]

FIG. 9 is a graph showing one example of a hierarchical cumulative probability density distribution of a spectrum of an envelope signal in a communication system such as a WiMAX or a LTE. In FIG. 9, the horizontal axis denotes frequency (MHz) and the vertical axis denotes a hierarchical cumulative probability density distribution (%).

As shown in FIG. 9, in the spectrum of the envelope signal in the communication system such as the WiMAX or the LTE, a component around DC reaches about 90%. In the case of the non-follow mode, the DC/DC converter 15 operates at a switching speed with a low efficiency with respect to the component around DC.

In this regard, the invention is to provide a power circuit which allows a DC/DC converter to operate at an operation speed with high efficiency with respect to the component around DC reaching about 90%, and can achieve high efficiency as a whole.

[Second Problem]

In the power circuit as shown in FIG. 6, the AC component, which can be made to follow due to an increase in the self-oscillating frequency, is increased, that is, the ratio of energy output from the DC/DC converter 15 with the high efficiency is increased, so that the high efficiency of the power circuit can be achieved. However, in the wideband communication system such as the WiMAX or the LTE, since the envelope exists in a wide range, if the switching frequency of the DC/DC converter 15 is raised, switching loss is increased, so that the efficiency of the power circuit is reduced.

Thus, in the wideband communication system, a circuit constant is set such that the AC component of a low frequency is supplied from the DC/DC converter 15 and the AC component of a high frequency is supplied from the OP amp 12. However, even in such a case, the current detector 14 detects the high AC component supplied from the OP amp 12. If the detected AC component exceeds a threshold value of the hysteresis comparator 13, the switch device 32 of the DC/DC converter 15 performs a switching operation, so that loss is increased. Consequently, the efficiency of the power circuit is reduced.

The loss of the switch device 32 of the DC/DC converter 15 will be described with reference to FIGS. 13(a) and 13(b).

FIG. 13(a) is a graph showing one example of a waveform of current I flowing through the switch device 32 as a function of time and a waveform of a voltage V applied between the supply voltage 31 and the node P as a function of time. In FIG. 13(a), the horizontal axis denotes time t and the vertical axis, denotes amplitude.

FIG. 13(b) is a graph showing one example of the loss of the switch device 32. In FIG. 13(a), the horizontal axis denotes time t and the vertical axis denotes the loss.

As shown in FIGS. 13(a) and 13(b), in the switch device 32, since the voltage V of an off section has a certain value but the current I does not flow, no loss occurs. Since the current I of an on section has a certain value but the voltage V is 0 [V], no loss occurs. The loss of the switch device 32 occurs in a transistion section in which the current I and the voltage V are changed.

Hence, the invention will be described while not considering a loss by an on resistor or the like while focusing on only the switching loss.

Herein, if a switching frequency is increased, that is to say, if the number of transistion sections is increased, the loss is larger. Thus, the relationship between the switching frequency and the efficiency is as shown in FIG. 14.

FIG. 14 is a graph showing one example of characteristics of the efficiency as a function of the switching frequency of the DC/DC converter 15. In FIG. 14, the horizontal axis denotes the switching frequency and the vertical axis denotes efficiency.

Further, even if the switching frequency is constant, the relationship between a duty ratio, which is a ratio of the on section and the off section, and efficiency is as shown in FIG. 15.

FIG. 15 is a graph showing one example of characteristics of the efficiency as a function of the duty ratio of the DC/DC converter 15. In FIG. 15, the horizontal axis denotes the duty ratio and the vertical axis denotes efficiency.

As shown in FIG. 15, if the duty ratio approaches zero, the transistion section approaches and overlaps, so that the loss becomes large. Further, since the switch device 32 does not completely perform a switching operation, the energy of the supply voltage 31 is not converted into output, so that the efficiency is reduced.

SUMMARY OF THE INVENTION

An advantage of some aspects of the invention is to provide a power circuit, for example, capable of preventing efficiency from being reduced by an increase in switching loss of a DC/DC converter (the DC/DC converter 15 in the example of FIG. 6) when a wideband envelope signal is received.

In order to achieve the object, according to the invention, a power circuit used for an amplifier has the following configuration.

That is, the power circuit includes an amplifier provided with a linear amplifier serving as a voltage source, a DC/DC converter serving as a current source, a hysteresis comparator controlling the DC/DC converter, and a current detector detecting output current from the linear amplifier to output the detected output current to the hysteresis comparator. Further, the power circuit further includes a switching restricting means for restricting a switching interval in the DC/DC converter such that the switching interval is not equal to or less than a constant interval or is not shorter than the constant time. The switching restricting means, for example, is provided at a front end portion or a rear end portion of the hysteresis comparator, or provided at both the front end portion and the rear end portion.

Thus, for example, when a wideband envelope signal is input, efficiency can be prevented from being reduced by an increase in the switching loss of the DC/DC converter.

In order to achieve the object, according to the invention, a power circuit used for an amplifier has the following configuration.

That is, the power circuit includes an amplifier provided with a linear amplifier serving as a voltage source, a DC/DC converter serving as a current source, a hysteresis comparator controlling the DC/DC converter, and a current detector detecting output current from the linear amplifier to output the detected output current to the hysteresis comparator. Further, the power circuit further includes a low pass filter provided between the current detector and an input side of the hysteresis comparator to restrict an operation frequency of the DC/DC converter.

Thus, for example, it is possible to realize the power circuit which allows the DC/DC converter to operate at an operation speed with high efficiency with respect to a component around DC reaching about 90%.

According to the invention, a power circuit used for an amplifier has the following configuration.

That is, the power circuit includes an amplifier provided with a first linear amplifier serving as a voltage source, a first DC/DC converter serving as a current source, a first hysteresis comparator controlling the first DC/DC converter, and a first current detector detecting output current from the first linear amplifier to output the detected output current to the first hysteresis comparator.

Further, an amplifier is used as a power circuit of the first linear amplifier, the amplifier including a second linear amplifier serving as a voltage source, a second DC/DC converter serving as a current source, a second hysteresis comparator controlling the second DC/DC converter, and a second current detector detecting output current from the second linear amplifier to output the detected output current to the second hysteresis comparator.

Thus, for example, the power circuit which has high efficiency as a whole can, be realized.

According to the invention, as one configuration example, in the above-described power circuit, with respect to one or both of the first hysteresis comparator and the second hysteresis comparator, a low pass filter is provided at an input side to the hysteresis comparator, thereby restricting the operation frequency of one or both of the first DC/DC converter and the second DC/DC converter.

Thus, for example, the power circuit which has high efficiency as a whole can be realized, and it is possible to realize the power circuit which allows the DC/DC converter to operate at an operation speed with high efficiency with respect to the component around DC reaching about 90%.

(Configuration 1) In order to achieve the object, according to the invention, a power circuit used for an amplifier has the following configuration.

That is, the power circuit includes a linear amplifier that serves as a voltage source, a DC/DC converter that serves as a current source, a current detector that detects an output current value from the linear amplifier, a hysteresis comparator that receives the current value detected by the current detector, and a switching interval restricting circuit that receives an output signal from the hysteresis comparator, restricts variation of the received signal such that a time interval of the timing, at which the received signal from the hysteresis comparator is changed, is equal to or larger than a constant time (or exceeds the constant time), and outputs a resulant signal as a control signal for switching the DC/DC converter.

Thus, for example, when a wideband envelope signal is input, efficiency can be prevented from being reduced by an increase in the switching loss of the DC/DC converter.

Herein, allowing the time interval to be equal to or larger than the constant time (or to exceed the constant time) corresponds to allowing the time interval not to be smaller (shorter) than the constant time (or not to be equal to or less than the constant time).

Further, various circuit configurations may be used as the switching interval restricting circuit.

(Configuration 2) The invention can employ the following configuration as one configuration example.

That is, the switching interval restricting circuit according to the configuration 1 is configured by an oscillator and a D flip flop (D-FF).

The oscillator supplies the D-FF with a clock signal, and the D-FF changes the input signal from the hysteresis comparator according to the clock signal from the oscillator, so that the switching interval restricting circuit outputs a resultant signal as a control signal for switching the DC/DC converter.

As described above, according to the power circuit of the invention, for example, when a wideband envelope signal is input, efficiency can be prevented from being reduced by an increase in the switching loss of the DC/DC converter.

BRIEF DESCRIPTION OF THE DRAWINGS

FIG. 4A is a graph showing one example of variation of input voltage of a waveform shaper as a function of time.

FIG. 4B is a graph showing one example of variation of output voltage of a waveform shaper as a function of time.

FIG. 5 is a block diagram showing a configuration example of an EER scheme of changing power by using a saturated amplifier according to the related art.

DETAILED DESCRIPTION OF THE PREFERRED EMBODIMENTS

Embodiment 1

Hereinafter, Embodiment 1 of the invention will be described with reference to the drawings.

Figure 1:
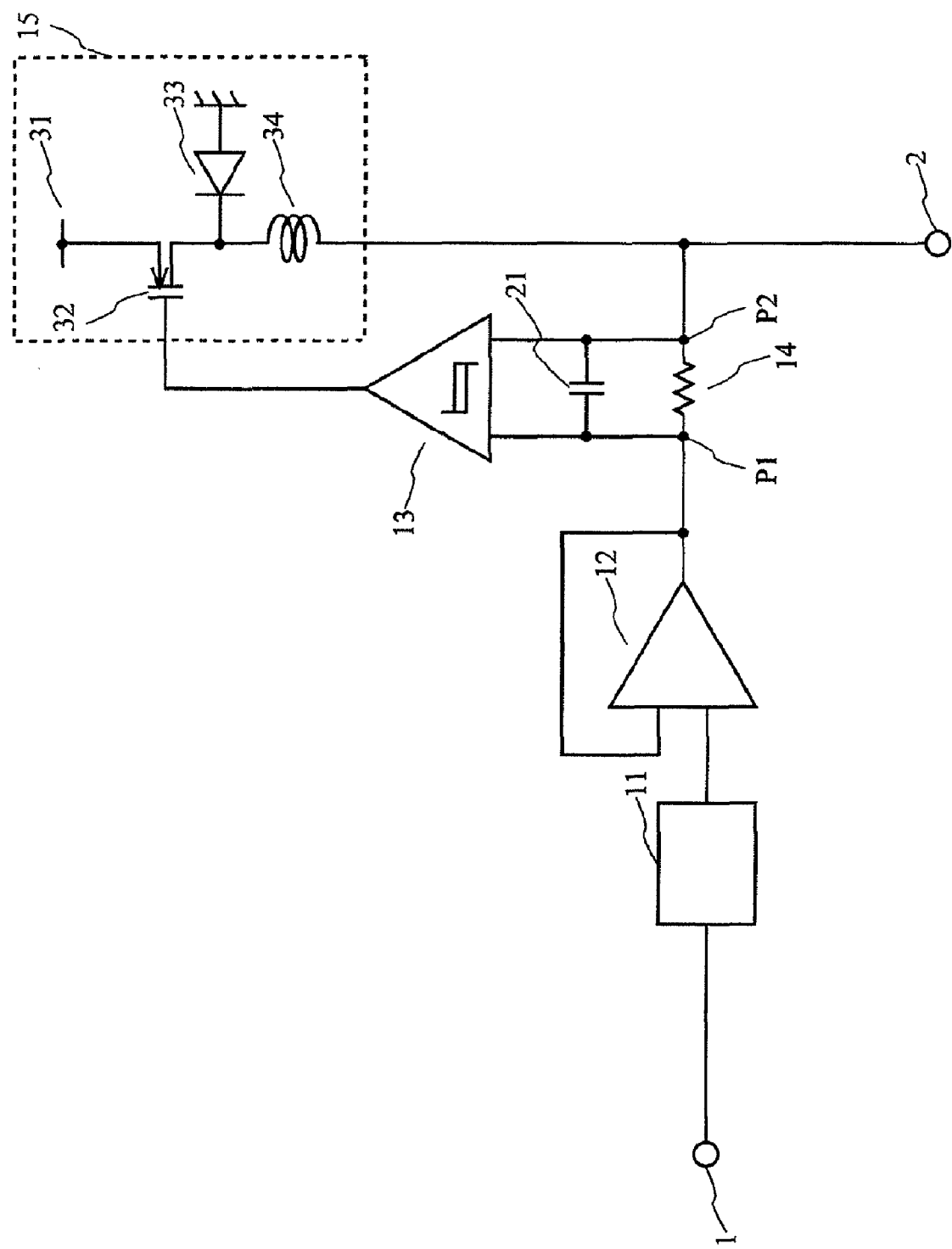
FIG. 1 is a circuit diagram showing a configuration example of an envelope amplifier (power circuit) according to one embodiment of the invention.

FIG. 1 is a circuit diagram showing an example of an envelope amplifier (power circuit) according to one embodiment of the invention. For the purpose of convenience, the same reference numerals are used to designate the same elements as those shown in FIG. 6, and it does not unnecessarily limit the invention.

The envelope amplifier of the embodiment includes a waveform shaper 11, an OP amp 12, a hysteresis comparator 13, a current detector 14, a capacitor 21 and a DC/DC converter 15, which are provided between an input terminal 1 and an output terminal 2.

The DC/DC converter 15 includes a supply voltage 31, a switch device 32, a diode 33 and an inductance 34.

Further, FIG. 1 shows nodes P1 and P2.

In detail, an input terminal of the waveform shaper 11 is connected to the input terminal 1, an output terminal of the waveform shaper 11 is connected to one input terminal of the OP amp 12, one end of the current detector (a resistor in the embodiment) 14 is connected to an output terminal of the OP amp 12, and the other end of the current detector 14 is connected to the output terminal 2. The capacitor 21 is connected in parallel to the current detector 14 through the nodes P1 and P2 at both ends of the current detector 14, and two input terminals of the hysteresis comparator 13 are connected to both ends of the capacitor 21. The supply voltage 31 and an output terminal of the hysteresis comparator 13 for control are connected to the switch device 32, the other end of the switch device 32 is connected to one end of the inductance 34, and the other end of the inductance 34 is connected to the output terminal 2. The grounded diode 33 is connected to one end of the inductance 34 in a forward direction from the ground terminal to an opposite side.

Figure 6:
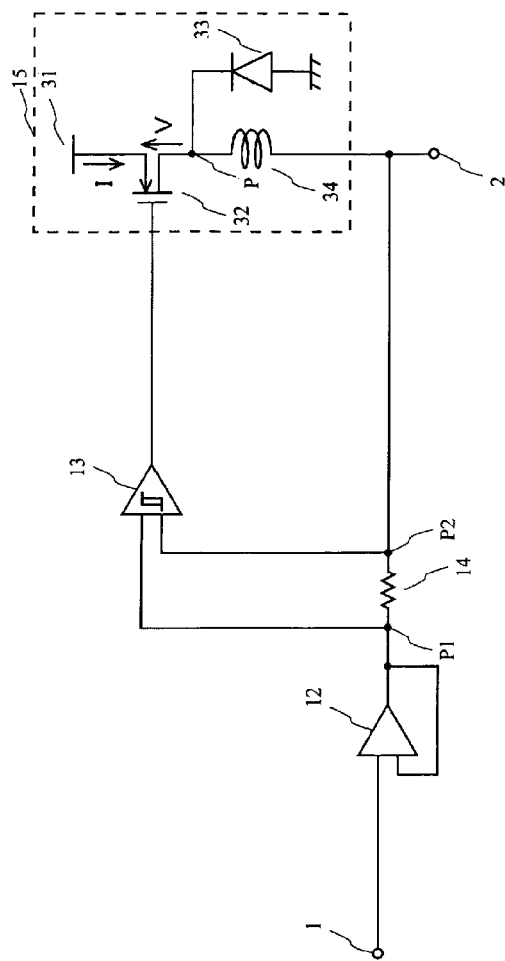
FIG. 6 is a circuit diagram showing a configuration example of an envelope amplifier (power circuit) that changes power.
Figure 7:
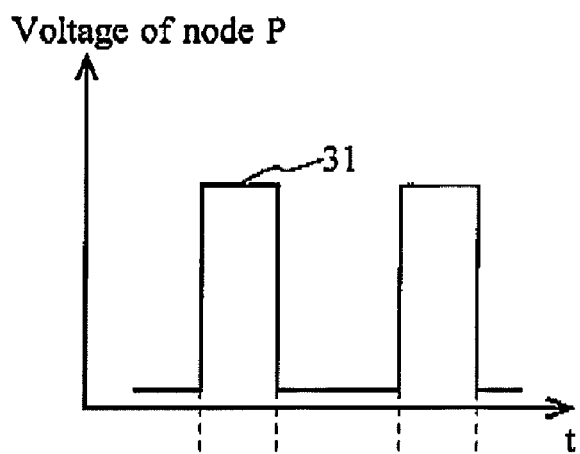
FIG. 7(a) is a graph showing one example of variation of a voltage of a node P as a function of time in a follow mode (DC).
FIG. 7(b) is a graph showing one example of variation of a voltage of a current detector as a function of time in a follow mode (DC).
Figure 7:
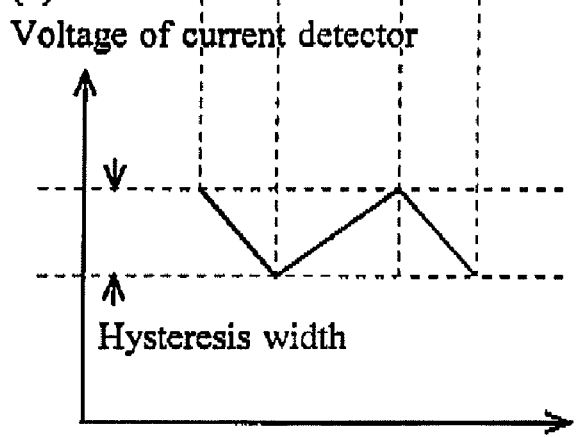
Figure 8:
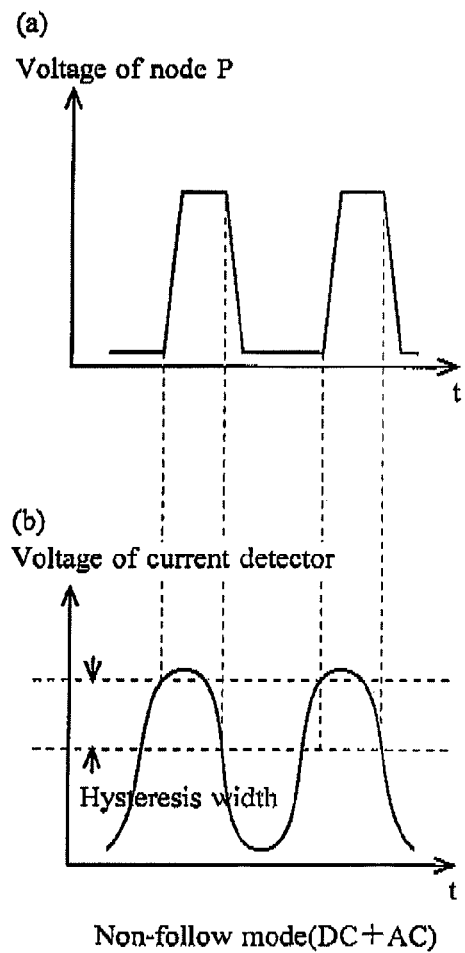
FIG. 8(a) is a graph showing one example of variation of a voltage of a node P as a function of time in a non-follow mode (DC+AC).
FIG. 8(b) is a graph showing one example of variation of a voltage of a current detector as a function of time in a non-follow mode (DC+AC).
Figure 9:
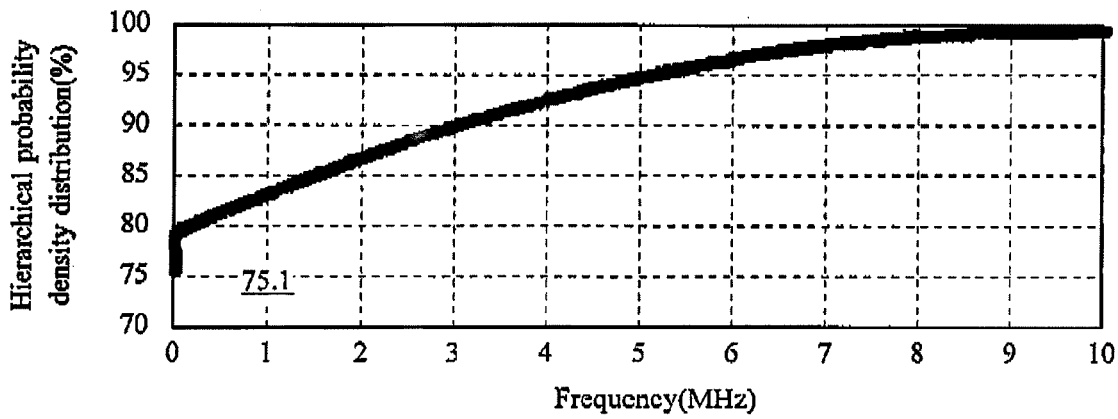
FIG. 9 is a graph showing one example of a hierarchical cumulative probability density distribution of a spectrum of an envelope signal in a communication system such as a WiMAX or a LTE.

The envelope amplifier of the embodiment further includes the waveform shaper 11 and the capacitor 21 for a low frequency pass as compared with the circuit configuration shown in FIG. 6.

The capacitor 21 for removing a high frequency is added, so that the current detector 14 does not detect a high frequency component, and the hysteresis comparator 13 compares only a low frequency portion of input. Thus, a switching frequency of the DC/DC converter 15 can be suppressed. That is, energy around DC about 90% can be operated with high efficiency.

According to the related art, when a bandwidth is wide due to high output of an input signal (envelope signal), high efficiency cannot, be achieved because a corresponding switching device does not exist. However, the high frequency signal removal filter (the capacitor 21 in the embodiment) of the invention is employed, so that high efficiency can be achieved. Further, it is possible to use a switching device or a driver (not shown) which has a low price and operates at a low speed, and it is possible to prevent an increase in the cost when using an EER scheme.

FIG. 4A is a graph showing one example of variation of input voltage of the waveform shaper 11 as a function of time. In FIG. 4A, the horizontal axis denotes time t and the vertical axis denotes the input voltage.

FIG. 4B is a graph showing one example of variation of output voltage of the waveform shaper 11 as a function of time. In FIG. 4B, the horizontal axis denotes time t and the vertical axis denotes the output voltage.

As shown in FIGS. 4A and 4B, when the input voltage is equal to or less than a certain level, the waveform shaper 11 maintains the input voltage as a constant voltage. This is for employing a quasi-EER scheme or an ET scheme because a high frequency amplier serving as a load of the output terminal 2 cannot deal with a low voltage.

In the embodiment, in order to show the principle, the envelope detector 112 is described by an analog image in FIG. 5. However, in other examples, a circuit including a waveform shaping part may be created by using a clock unit (e.g., a digital signal processor or the like) through which amplitude information is understood.

Figure 2:
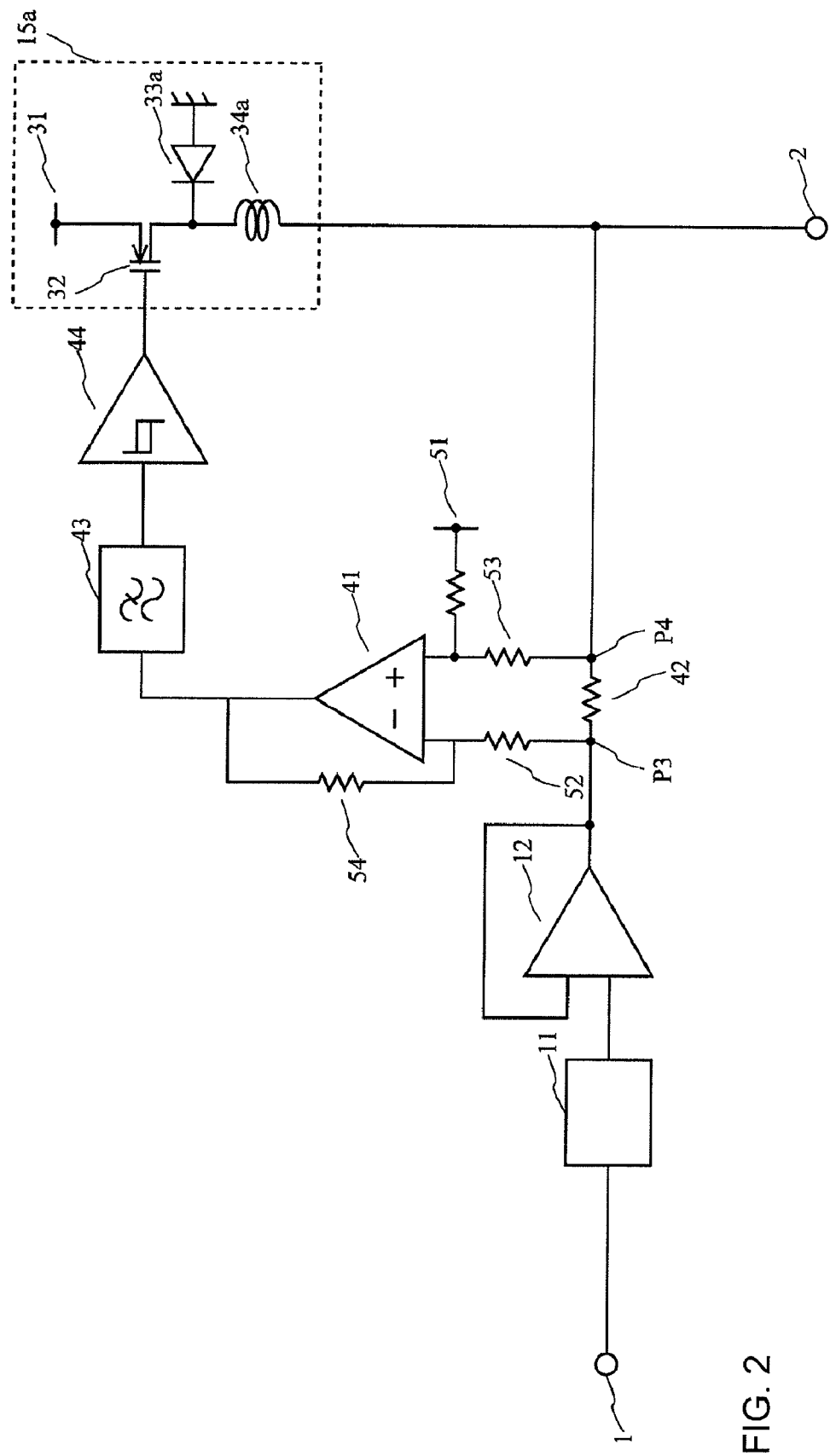
FIG. 2 is a circuit diagram showing a configuration example of an envelope amplifier (power circuit) according to another embodiment.

FIG. 2 is a circuit diagram showing an example of an envelope amplifier (power circuit) according to another embodiment. For the purpose of convenience, the same reference numerals are used to designate the same elements as those shown in FIG. 1.

The envelope amplifier of the embodiment includes a waveform shaper 11, an OP amp 12, an OP amp 41, four resistors 51 to 54, a current detector 42, a low pass filter (LPF) 43, a hysteresis comparator 44, and a DC/DC converter 15a, which are provided between an input terminal 1 and an output terminal 2.

The DC/DC converter 15a includes a supply voltage 31, a switch device 32, a diode 33a and an inductance 34a.

Further, FIG. 2 shows nodes P3 and P4.

In detail, an input terminal of the waveform shaper 11 is connected to the input terminal 1, an output terminal of the waveform shaper 11 is connected to one input terminal of the OP amp 12, one end of the current detector (a resistor in the embodiment) 42 is connected to an output terminal of the OP amp 12, and the other end of the current detector 42 is connected to the output terminal 2. The resistors 52 and 53 are respectively connected to the nodes P3 and P4 at both ends of the current detector 42, and two input terminals of the OP amp 41 are connected to the resistors 52 and 53. Further, one end of the resistor 51 for supplying a supply voltage is connected to one input terminal of the OP amp 41, and the other input terminal of the OP amp 41 is connected to an output terminal of the OP amp 41 through the resistor 54. The output terminal of the OP amp 41 is connected to one end of the low pass filter 43, and the other end of the low pass filter 43 is connected to an input terminal of the hysteresis comparator 44. The supply voltage 31 and an output terminal of the hysteresis comparator 44 for control are connected to the switch device 32, the other end of the switch device 32 is connected to one end of the inductance 34a, and the other end of the inductance 34a is connected to the output terminal 2. The grounded diode 33a is connected to one end of the inductance 34a in a forward direction from the ground terminal to an opposite side.

According to the circuit of the envelope amplifier as shown in FIG. 2, as compared with the circuit as shown in FIG. 1, current is detected using a differential amplifier including the resistors 51 to 54 and the OP amp 41, and a high frequency component is removed by the low pass filter 43, so that it is possible to obtain an effect identical to the effect obtained by the circuit as shown in FIG. 1.

Next, a configuration example for achieving higher efficiency will be described.

The OP amp 12 as shown in FIGS. 1 and 2 completely supplies power of the high frequency portion. Even when the final stage of the OP amp 12 is configured as a B class amplifier, since a peak factor of an envelope signal is high, power consumption is high.

In this regard, it is important to improve the power efficiency of the OP amp 12.

Figure 3:
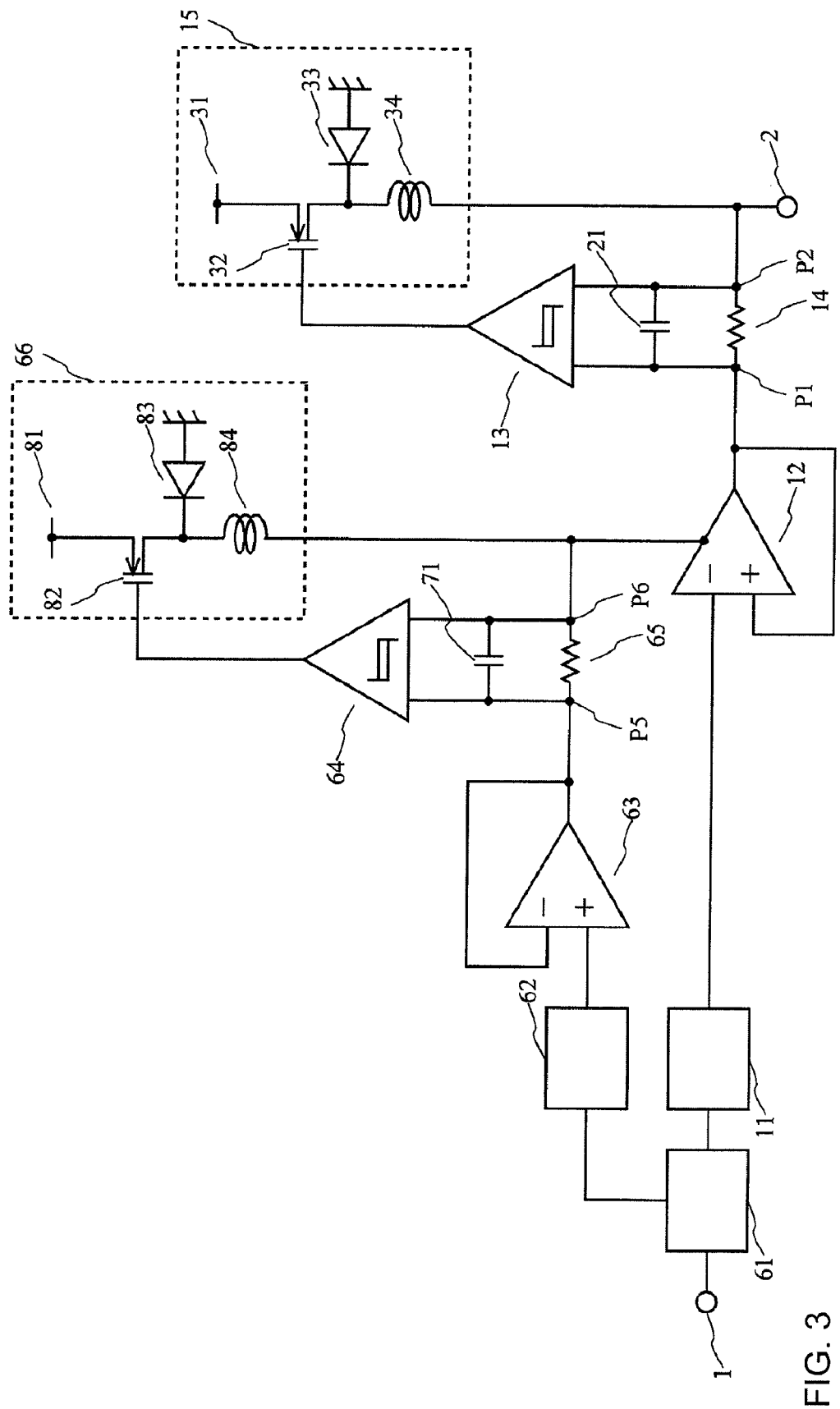
FIG. 3 is a circuit diagram showing a configuration example of an envelope amplifier (power circuit) in which an OP amp is configured by a quasi-EER scheme.

FIG. 3 is a circuit diagram showing a configuration example of an envelope amplifier (power circuit) in which the OP amp 12 is configured by the quasi-EER scheme or the ET scheme. Herein, the reason for employing the quasi-EER scheme is because an OP amp operation does not correspond to a supply voltage 0 V and a minimum voltage V is required.

The operation of the circuit as shown in FIG. 3, for example, is identical to that of the circuit as shown in FIG. 1. For the purpose of convenience, the same reference numerals are used to designate the same elements as those shown in FIG. 1.

The envelope amplifier of the embodiment includes the elements 11 to 15, 21 which are identical to those shown in FIG. 1 while being provided between the input terminal 1 and the output terminal 2. Further, a distributor 61 is provided between the input terminal 1 and the waveform shaper 11. Further, circuits, which are identical to those shown in FIG. 1, are provided between the ditributor 61 and a power supply terminal of the OP amp 12. In detail, a waveform shaper 62, an OP amp 63, a hysteresis comparator 64, a current detector (a resistor in the embodiment) 65, a capacitor 71 and a DC/DC converter 66 are provided therebetween.

The DC/DC converter 66 includes a supply voltage 81, a switch device 82, a diode 83 and an inductance 84.

Further, FIG. 3 shows nodes P1 and P2, and nodes P5 and P6.

Next, an example of an operation of parts not shown in FIG. 1 will be described.

First, an envelope signal is input to the input terminal 1 and is distributed into two by the distributor 61. The two distribution signals are input to the waveform shaper 11 and the waveform shaper 62, respectively.

If an input voltage is lower than a predetermined level, the waveform shaper 62 outputs a voltage of a certain level with respect to one distributed signal. When the input voltage is higher than the predetermined level, the waveform shaper 62 outputs the input voltage. This is identical to that shown in FIGS. 4A and 4B.

After the signal waveform-shaped by the waveform shaper 62 is processed by a circuit that performs the same operation as that of the circuit in FIG. 1, the resultant power is supplied to the OP amp 12.

The DC portion of the power supplied to the OP amp 12 is supplied from the DC/DC converter 66 with high efficiency, and the high frequency portion of the AC portion thereof is supplied from the OP amp 63.

In relation to power consumption of the OP amp 63, since the DC component is large and the AC component is small in the waveform-shaped signal although depending on the waveform shaping quantity, the power consumption of the OP amp 63 corresponds only to 10% of power consumption of the OP amp 12. Thus, the OP amp 12 operates with high efficiency.

The other signal distributed by the distributor 61 is input to the input terminal of the OP amp 12 via the waveform shaper 11, and the subsequent operation is identical to that of the circuit as shown in FIG. 1 or FIG. 2. The LPF of FIG. 2 may be employed as the capacitors 21 and 71 of FIG. 3 for removing the high frequency portion.

Hereinafter, the schematic efficiency of the circuit as shown in FIG. 1 and the circuit as shown in FIG. 3 will be calculated using the following conditions 1 to 4.

(Condition 1) The efficiencies of the DC/DC converter 15 and the DC/DC converter 66 are both 93%.

(Condition 2) 85% of energy is supplied at the operation frequency 1.5 MHz of the DC/DC converter 15 and the DC/DC converter 66.

(Condition 3) 15% of energy is supplied at an amplifier band 1.5 MHz or more of the OP amp 12 and the OP amp 63.

(Condition 4) The average efficiency of the OP amp 12 and the OP amp 63 is 20%.

In such conditions, the entire efficiency Z1 of the circuit as shown in FIG. 1 is calculated as follows.

$$Z1=1/(0.85/0.93+0.15/0.2)=0.6$$

Further, the entire efficiency Z2 of the circuit as shown in FIG. 3 is calculated as follows.

$$Z2=1/(0.85/0.93+0.15/(0.85/0.93+0.15/0.2))=0.85$$

In this way, the linear assist class BD amplifier is used as a power source in which power used for the linear amplifier is changed based on the envelope information, the low pass filter is inserted after the current detection of the linear assist class BD amplifier so that information of a high frequency component is not detected, and the operation frequency of the class D amplifier (the DC/DC converter) is restricted, so that the efficient power circuit can be realized and the efficiency thereof can be significantly improved.

As described above, the efficiency can be improved using both the method of operating the DC/DC converter 15 by suppressing the high frequency portion and the method of achieving high efficiency by constructing the OP amp 12 by the ET scheme or the EER (or quasi-EER) scheme. However, for example, the methods may be independently used depending on the required performance.

Hereinafter, the waveform shapers 11 and 62, the EER scheme, the quasi-EER scheme and the ET scheme will be described.

The circuits as shown in FIGS. 1 to 3 include the waveform shapers 11 and 62. The reason for this is because a voltage of a predetermiend level or more is required to drive the high frequency amplifier serving as a load of the power circuit as described above. Further, by this reason, shaping of the envelope waveform input as shown in FIGS. 4A and 4B is referred to as the quasi-EER scheme.

Such a waveform shaper itself is described as an embodiment because many cases exist in which the quasi-EER scheme is achieved using the waveform shaper when actually realizing the amplifying circuit as shown in the embodiment at present. In other examples, the waveform shaper may not be provided.

There exist differences among the EER scheme, the quasi-EER scheme and the ET scheme in terms of amplification of an amplitude component.

According to the EER scheme, basically, an input amplitude component (envelope) is amplified by a power circuit.

According to the quasi-EER scheme, waveform shaping is performed using the waveform shaper as shown in FIGS. 4A and 4B, and a DC component is always output from a power circuit.

According to the ET scheme, only a lower frequency component is amplified by a power circuit so that a high frequency amplifier is driven, without completely following an amplitude component (envelope).

Figure 10:
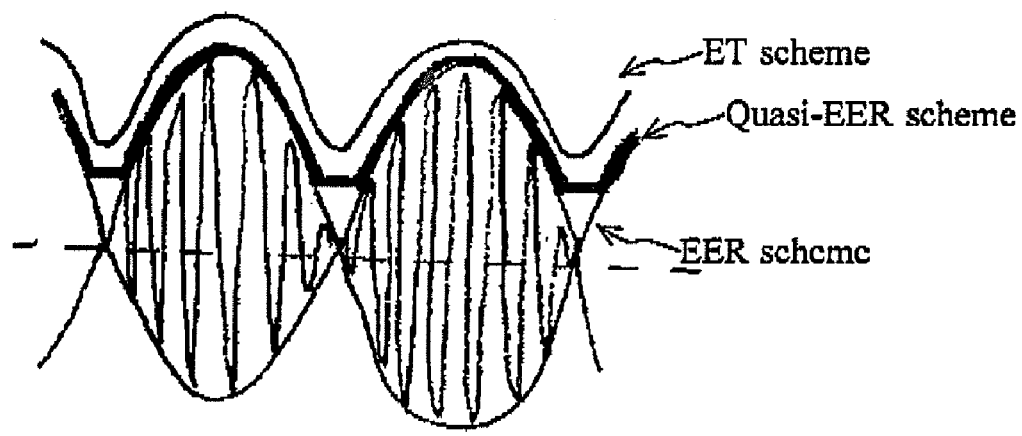
FIG. 10 is a view showing one example of a result of an envelope process in an EER scheme, a quasi-EER scheme and an ET scheme.

FIG. 10 is a view showing one example of a result of an envelope process in the EER scheme, the quasi-EER scheme and the ET scheme.

As described above, the envelope amplifier (power circuit) according to the embodiment, for example, is a power circuit (linear assist class BD amplifier) used for an amplifier employing the EER scheme or the like, and has the following examples 1 to 3.

Example 1

The low pass filters (the capacitor 21, the low pass filter 43 and the capacitor 71 in the embodiment) are each inserted to input to the hysteresis comparators 13, 44 and 64 constituting the linear assist class BD amplifier, so that the operation frequency of the class D amplifier is suppressed.

In detail, in the embodiment, the linear assist class BD amplifier is used as a power source in which power used for the linear amplifier is changed based on the envelope information, the low pass filter is inserted after the current detection of the linear assist class BD amplifier so that information of a high frequency component is removed, and the operation frequency of the class D amplifier (the DC/DC converter) is restricted, so that the efficient power circuit can be realized (e.g., the configurations of FIGS. 1 to 3).

Example 2

The linear assist class BD amplifier is applied to the linear amplifier (the OP amp 12 in the embodiment) constituting the linear assist class BD amplifier.

In detail, in the embodiment, the linear assist class BD amplifier is used as a power source in which power used for the linear amplifier is changed based on the envelope information, and the linear assist class BD amplifier is employed with respect to the power of the linear assist class BD amplifier (e.g., the configuration of FIG. 3).

Example 3

In relation to the two linear assist class BD amplifiers in the above-described configuration example 2, all four patterns are obtained according to the combination with the configuration example 1. That is, there exists a pattern, in which the low pass filter (LPF) in the above-described example 1 is inserted into the two amplifiers, and a pattern in which the low pass filter is not inserted into the two amplifiers.

In detail, in relation to one or both of the two linear assist class BD amplifiers, the low pass filter is inserted after the current detection of the linear assist class BD amplifier so that information of the high frequency component is removed, and the operation frequency of the class D amplifier (the DC/DC converter) is restricted, so that the efficient power circuit can be realized (e.g., the configuration of FIG. 3 when the low pass filters are inserted into the two linear assist class BD amplifiers). That is, in the above-described example 2, the low pass filter (LPF) is inserted into at least one of the two linear assist class BD amplifiers.

Herein, the linear assist class BD amplifier itself is well known in the related art. However, as one example, it can be represented as an "amplifier including a linear amplifier (OP amps 12 and 63 in the embodiment) serving as a voltage source, a DC/DC converter (DC/DC converters 15, 15a and 66 in the embodiment) serving as a current source, a hysteresis comparator (hysteresis comparators 13, 44 and 64 in the embodiment) controlling the DC/DC converter, and a current detector (current detectors 14, 42 and 65 in the embodiment) detecting output current from the linear amplifier to output the detected output current to the hysteresis comparator". That is, it can be referred to as a linear assist class BD amplifier which supplies a high frequency portion through a class B.

As described above, according to the envelope amplifier (power circuit) of the example, the switching operation speed is suppressed, so that low cost and high efficiency can be achieved. Further, the linear amplifier supplying a high frequency is constructed by the EER (or quasi-EER) scheme or the ET scheme, so that the efficiency can be significantly improved.

According to the power circuit as shown in FIG. 1, the OP amp 12 (linear amplifier), the DC/DC converter 15, the hysteresis comparator 13, the current detector 14 and the low pass filter (LPF) 21 are provided. Further, in the embodiment, the waveform shaper 11 is provided.

Further, according to the power circuit shown in FIG. 2, the OP amp 12 (linear amplifier), the DC/DC converter 15a, the hysteresis comparator 44, the current detector 42 and the low pass filter (LPF) 43 are provided. Further, in the embodiment, the waveform shaper 11 is provided.

In addition, according to the power circuit shown in FIG. 3, the first OP amp 12 (first linear amplifier), the first DC/DC converter 15, the first hysteresis comparator 13, the first current detector 14 and the first low pass filter (LPF) 21 are provided in a main power circuit of the power circuit. Further, the second OP amp 63 (second linear amplifier), the second DC/DC converter 66, the second hysteresis comparator 64, the second current detector 65 and the second low pass filter (LPF) 71 are provided in a sub-power circuit with respect to the main power circuit.

Further, in the embodiment, the waveform shapers 11 and 62 are provided in the main power circuit and the sub-power circuit. However, the waveform shaper may be provided to only one of the two power circuits, or may not be provided to both of the two power circuits. In addition, the LPF has only to be provided between the current detector and the switch device.

Herein, the configuration of the system, the apparatus or the like according to the invention is not limited to the above-described configurations, and various configurations may be used. Further, the invention can be provided as, for example, a method or a scheme of performing the process according to the invention, a program for realizing such a method or scheme, or a recording medium which records the program. Further, the invention can also be provided as various systems or apparatuses.

Further, an application field of the invention is not limited to the above-described field, and the invention can be applied to various fields.

In addition, for example, various processes can be performed in the system, and the apparatus or the like according to the invention may be controlled by a processor which is provided in a hardware resource including a processor, a memory or the like to execute a control program stored in a ROM (Read Only Memory). Further, for example, each function unit for performing the processes may also be configured as an independent hardware circuit.

Moreover, the invention can be understood as a computer-readable recording medium such as a floppy disk (registered trademark) or a CD (Compact Disc)-ROM which stores the control program, or the program itself. The processes according to the invention can be performed by executing the control program input to a computer from the recording medium under the control of the processor.

Embodiment 2

Hereinafter, Embodiment 2 according to the invention will be described with reference to the accompanying drawings.

In the second embodiment, the invention is applied to a power circuit of a power amplifier used for a transmitter that performs radio communication by using a wideband high frequency signal.

Figure 11:
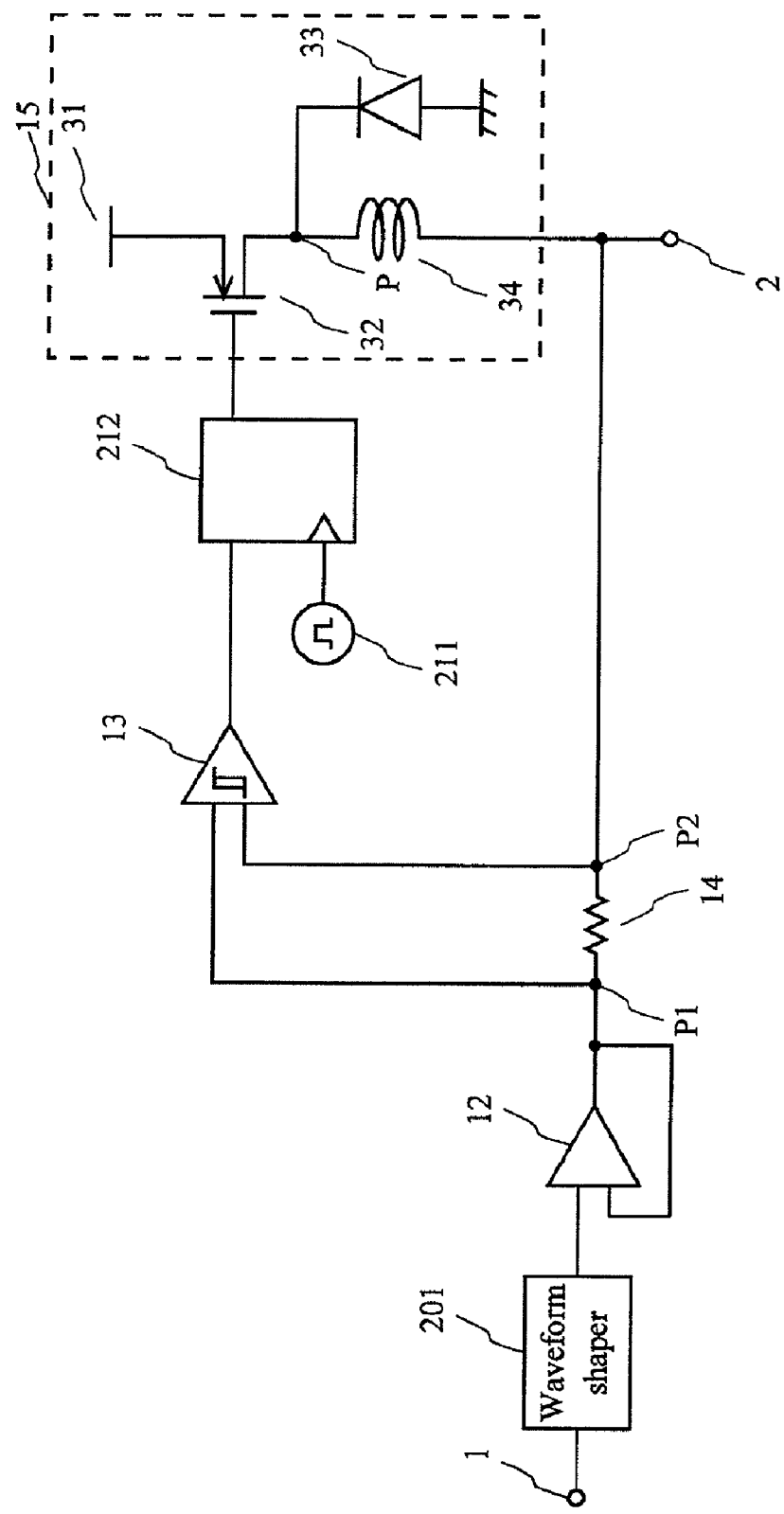
FIG. 11 is a circuit diagram showing a configuration example of an envelope amplifier (power circuit) according to one embodiment of the invention.

FIG. 11 is a circuit diagram showing an example of an envelope amplifier (power circuit) according to one embodiment of the invention. For the purpose of convenience, the same reference numerals are used to designate the same elements as those shown in FIG. 6, and such should not unnecessarily limit the invention.

The envelope amplifier (power circuit) of the embodiment includes a waveform shaper 201, an OP amp 12 serving as a voltage source, a hysteresis comparator 13, a current detector 14, an oscillator 211, a D flip flop (D-FF) 212, and a DC/DC converter 15 serving as a current source, which are provided between an input terminal 1 and an output terminal 2.

The DC/DC converter 15 includes a supply voltage 31, a switch device 32, a diode 33 and an inductance 34.

Further, FIG. 11 shows nodes P, P1 and P2.

In detail, an input terminal of the waveform shaper 201 is connected to the input terminal 1, an output terminal of the waveform shaper 201 is connected to one input terminal of the OP amp 12, one end of the current detector (a resistor in the embodiment) 14 is connected to an output terminal of the OP amp 12, and the other end of the current detector 14 is connected to the output terminal 2. Two input terminals of the hysteresis comparator 13 are connected to the nodes P1 and P2 at both ends of the current detector 14. An input terminal of the D-FF 212 is connected to an output terminal of the hysteresis comparator 13, and an output terminal of the oscillator 211 is connected to a clock input terminal of the D-FF 212.

The supply voltage 31 and an output terminal (indirectly, the output terminal of the hysteresis comparator 13 for control) of the D-FF 212 are connected to the switch device 32, the other end of the switch device 32 is connected to one end of the inductance 34, and the other end of the inductance 34 is connected to the output terminal 2. The grounded diode 33 is connected to one end of the inductance 34 in a forward direction from the ground terminal to an opposite side.

As compared with the circuit configuration shown in FIG. 6, the envelope amplifier (power circuit) of the embodiment further includes the waveform shaper 201, the oscillator 211 and the D-FF 212.

Herein, according to the embodiment, in relation to a signal output from the D-FF 212, time from "on" to "off" (or time from "off" to "on") is not shorter than a reciprocal (1/F) of an oscillation frequency F of the oscillator 211.

When an input voltage is equal to or less than a predetermined level, the waveform shaper 201, which is provided with respect to input of the envelope amplifier (power circuit), maintains the input voltage as a constant voltage (e.g., the level). This is for employing the quasi-EER scheme or the ET scheme because a high frequency amplifier serving as a load of the output terminal 2 cannot deal with a low voltage.

Hereinafter, the waveform shaper 201, the EER scheme, the quasi-EER scheme and the ET scheme will be described.

The circuit as shown in FIG. 11 includes the waveform shaper 201. The reason for this is because a voltage of a predetermiend level or more is required to drive the high frequency amplifier serving as a load of the power circuit as described above. Further, by this reason, shaping of the input envelope waveform is referred to as the quasi-EER scheme.

Such a waveform shaper itself is described as an embodiment because many cases exist in which the quasi-EER scheme is achieved using the waveform shaper when actually realizing the amplifying circuit as shown in the embodiment at present. In other examples, the waveform shaper may not be provided.

There exists a schematic difference among the EER scheme, the quasi-EER scheme and the ET scheme in terms of amplification of an amplitude component.

According to the EER scheme, basically, an input amplitude component (envelope) is amplified by a power circuit.

According to the quasi-EER scheme, waveform shaping is performed using the waveform shaper, and a DC component is always output from a power circuit.

According to the ET scheme, only a lower frequency component is amplified by a power circuit so that a high frequency amplifier is driven, without completely following an amplitude component (envelope).

Figure 12:
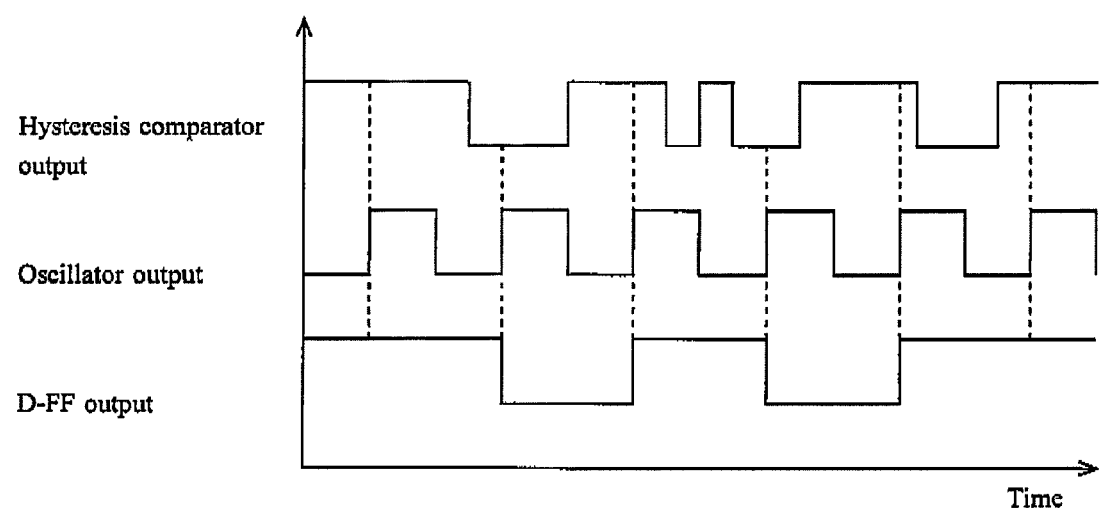
FIG. 12 is a view showing one example of waveforms of each element.
Figure 13:
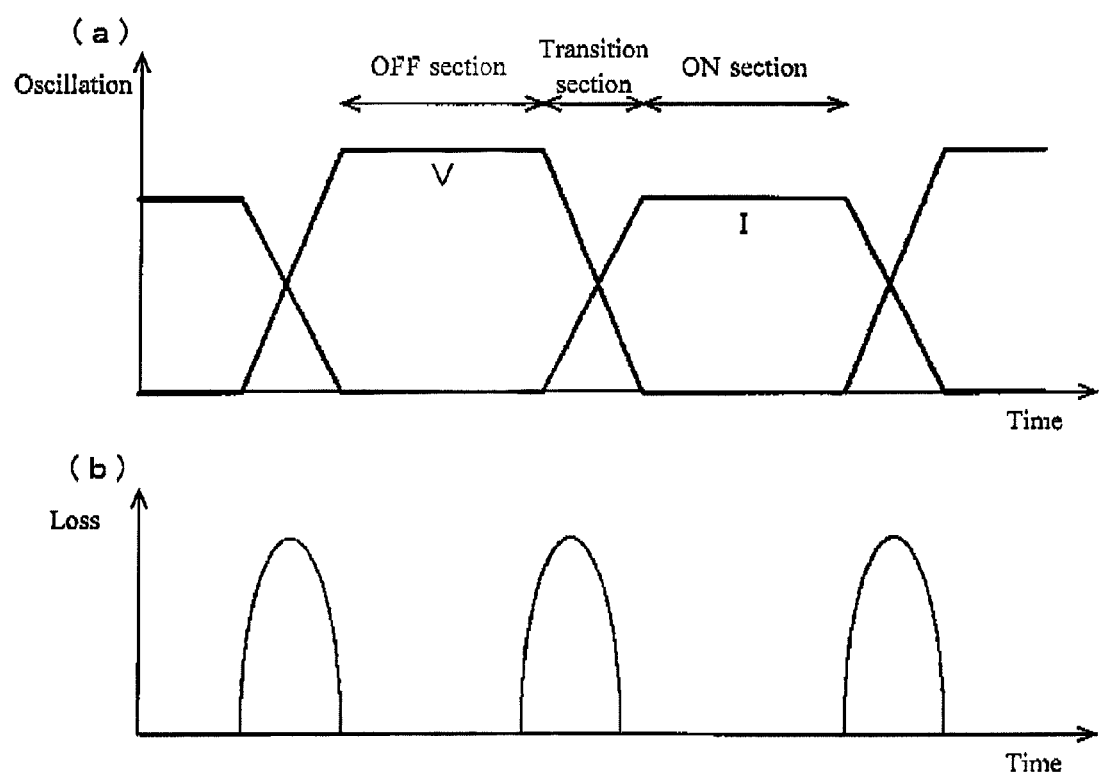
FIG. 13(a) is a graph showing one example of variation of a current and a voltage of a switch device as a function of time.
FIG. 13(b) is a graph showing one example of variation of a loss of a switch device as a function of time.
Figure 14:
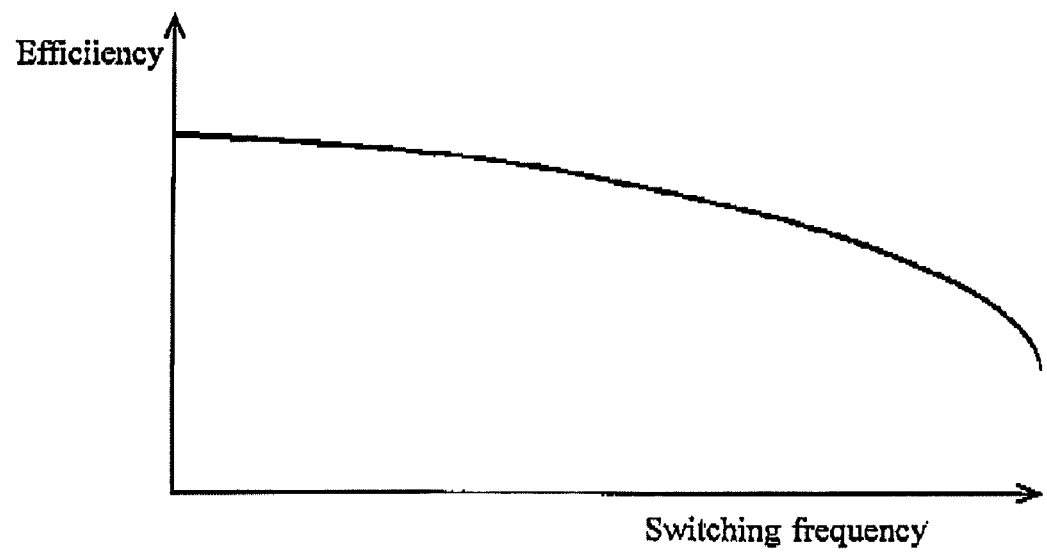
FIG. 14 is a graph showing one example of characteristics of the efficiency as a function of a switching frequency of a DC/DC converter.
Figure 15:
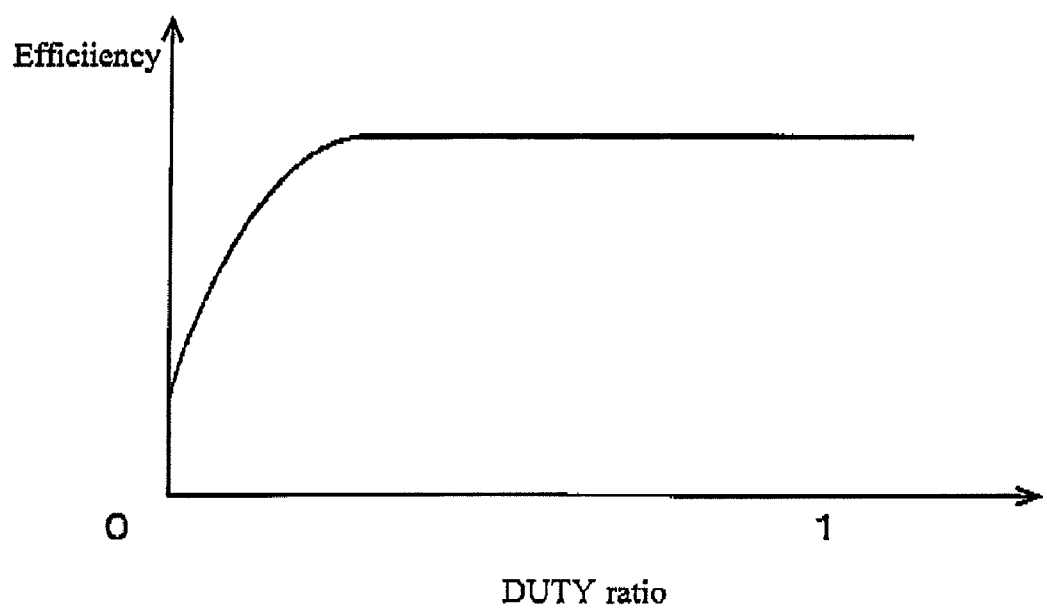
FIG. 15 is a graph showing one example of characteristics of the efficiency as a function of a duty ratio of a DC/DC converter.

FIG. 12 is a graph showing one example of an output waveform from the hysteresis comparator 13, an output waveform from the oscillator 211, and an output waveform from the D-FF 212. In FIG. 12, the horizontal axis denotes time t and the vertical axis denotes the waveforms.

Since the output waveform from the hysteresis comparator 13 is maintained by the D-FF 212 at the start timing of the output waveform from the oscillator 211, the switch device 32 is not switched for an interval which is shorter than the period of the output waveform from the oscillator 211. By this reason, even if any signal is input to the power circuit, since the switch device 32 is not switched from "on" to "off" (or from "off" to "on") for an interval which is shorter than the period of the oscillator 211, the switching loss of the DC/DC converter 15 is not equal to or more than a predetermined loss.

As described above, according to the embodiment, in the power circuit operating at a high speed in which the OP amp 12 and the DC/DC converter 15 are provided, the DC/DC converter 15 is controlled by the current detector 14, which detects a value of current output from the OP amp 12, and the hysteresis comparator 13, and the output from the DC/DC converter 15 is connected to the output from the OP amp 12 through the current detector 14, the circuit (the oscillator 211 and the D-FF 212 in the embodiment) is provided between the hysteresis comparator 13 and the DC/DC converter 15 to restrict the interval from "on" to "off" (or from "off" to "on") such that the interval is not shorter than a predetermined value.

In detail, the oscillator 211 and the D-FF 212 are provided between the hysteresis comparator 13 and the DC/DC converter 15, so that a control signal of the DC/DC converter 15 output from the hysteresis comparator 13 is not switched from "on" to "off" (or from "off" to "on") at the interval which is shorter than the period of the oscillator 211.

According to the embodiment, as one example, the power circuit used for the amplifier (e.g., the main amplifier 115 as shown in FIG. 5) includes the linear amplifier (the OP amp 12 in the embodiment), the DC/DC converter 15, the current detector 14 that detects an output current value from the linear amplifier to output the detected current value, the hysteresis comparator 13 that receives the current value detected by the current detector 14, and the switching interval restricting circuit (the oscillator 211 and the D-FF 212 in the embodiment) that receives an output signal from the hysteresis comparator 13, restricts variation of the received signal such that a time interval of the timing, at which the received signal from the hysteresis comparator 13 is changed, is not shorter than a constant time, and outputs a control signal for switching the DC/DC converter 15.

According to one detailed example, the switching interval restricting circuit is configured by the oscillator 211 and the D-FF 212, the oscillator 211 supplies the D-FF 212 with a clock, and the D-FF 212 changes the input signal from the hysteresis comparator 13 according to the clock from the oscillator 211, so that the switching interval restricting circuit outputs the control signal for switching the DC/DC converter 15.

As described above, according to the envelope amplifier (power circuit) of the embodiment, the function unit (the oscillator 211 and the D-FF 212 in the embodiment) for restricting the switching interval is inserted into a rear end portion of the hysteresis comparator 13, so that the efficiency of the DC/DC converter 15 can be improved.

Thus, according to the envelope amplifier (power circuit) of the embodiment, for example, even if a wideband signal is input to the power circuit, the switching interval of the DC/DC converter 15 is not shorter than a constant period, so that the switching loss of the DC/DC converter 15 can be suppressed, which can contribute to an increase in the efficiency of the power circuit.

In detail, as described above, even if a DC component and an AC component of a low frequency are supplied from the DC/DC converter 15 and an AC component of a high frequency is supplied from the OP amp 12, the current detector 14 detects the high AC component. If the detected value exceeds a threshold value of the hysteresis comparator 13, the DC/DC converter 15 performs a switching operation, so that the loss is increased and the efficiency is reduced. Further, even if the switching frequency is the same, the duty ratio approaches zero, and the efficiency is reduced.

In this regard, according to the embodiment, the output waveform of the hysteresis comparator 13 is restricted such that the interval from "on" to "off" (or time from "off" to "on") is not shorter than a constant time as an effective technique, so that the efficiency of the power circuit is prevented from being reduced. In this way, for example, when a wideband envelope signal is input, efficiency can be prevented from being reduced by an increase in the switching loss of the DC/DC converter 15.

Herein, the configuration of the system, the apparatus or the like according to the invention is not limited to the above-described configuration, and various configurations may be used. Further, the invention can be provided as, for example, a method or a scheme of performing the process according to the invention, a program for realizing such a method or scheme, or a recording medium which records the program. Further, the invention can also be provided as various systems or apparatuses.

Further, an application field of the invention is not limited to the above-described field, and the invention can be applied to various fields.

In addition, for example, various processes performed in the system, the apparatus or the like according to the invention may be controlled by a processor which is provided in a hardware resource including a processor, a memory or the like to execute a control program stored in a ROM (Read Only Memory). Further, for example, each function unit for performing the processes may also be configured as an independent hardware circuit.

Moreover, the invention can be understood as a computer-readable recording medium such as a floppy disk (registered trademark) or a CD (Compact Disc)-ROM which stores the control program, or the program itself. The processes according to the invention can be performed by executing the control program input to a computer from the recording medium under the control of the processor.

What is claimed is:

1. A power circuit used for an amplifier, comprising:
an amplifier including a linear amplifier serving as a voltage source, a DC/DC converter serving as a current source, a hysteresis comparator controlling the DC/DC converter, and a current detector detecting output current from the linear amplifier to output the detected output current to the hysteresis comparator; and
a switching restricting means for restricting a switching interval in the DC/DC converter such that the switching interval is not equal to or less than a constant time or is not shorter than the constant time.

2. A power circuit used for an amplifier, comprising:
an amplifier including a linear amplifier serving as a voltage source, a DC/DC converter serving as a current source, a hysteresis comparator controlling the DC/DC converter, and a current detector detecting output current from the linear amplifier to output the detected output current to the hysteresis comparator, and
a low pass filter provided between the current detector and an input side of the hysteresis comparator to restrict an operation frequency of the Dc/DC converter.

3. A power circuit used for an amplifier, comprising;
an amplifier including a first linear amplifier serving as a voltage source, a first DC/DC converter serving as a current source, a first hysteresis comparator controlling the first DC/DC converter, and a first current detector detecting output current from the first linear amplifier to output the detected output current to the first hysteresis comparator;
an amplifier, as a power circuit of the first linear amplifier, including a second linear amplifier serving as a voltage source, a second DC/DC converter serving as a current source, a second hysteresis comparator controlling the second DC/DC converter, and a second current detector detecting output current from the second linear amplifier to output the detected output current to the second hysteresis comparator; and
a low pass filter provided at one or both of between the first current detector and the first hysteresis comparator and between the second current detector and the second hysteresis comparator, thereby restricting an operation frequency of one or both of the first DC/DC converter and the second DC/DC converter.

4. A power circuit used for an amplifier, comprising:
a linear amplifier that serves as a voltage source;
a DC/DC converter that serves as a current source;
a current detector that detects an output current value from the linear amplifier;
a hysteresis comparator that receives the current value detected by the current detector; and
a switching interval restricting circuit that receives an output signal from the hysteresis comparator, restricts variation of the received signal such that a time interval of a timing, at which the received signal from the hysteresis comparator is changed, is equal to or larger than a constant time or exceeds the constant time, and outputs a resultant signal as a control signal for switching the DC/DC converter.

* * * * *